(12) United States Patent
Preuss et al.

(10) Patent No.: US 9,761,512 B2
(45) Date of Patent: Sep. 12, 2017

(54) LEADFRAME ASSEMBLY, HOUSING ASSEMBLY, MODULE ASSEMBLY AND METHOD OF DETERMINING AT LEAST ONE VALUE OF A MEASUREMENT VARIABLE OF AN ELECTRONIC MODULE

(71) Applicant: OSRAM Opto Semiconductors GmbH, Regensburg (DE)

(72) Inventors: Stephan Preuss, Bad Abbach (DE); Michael Zitzlsperger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 287 days.

(21) Appl. No.: 14/644,268

(22) Filed: Mar. 11, 2015

(65) Prior Publication Data

US 2015/0187685 A1    Jul. 2, 2015

Related U.S. Application Data

(63) Continuation of application No. PCT/EP2013/069504, filed on Sep. 19, 2013.

(30) Foreign Application Priority Data

Sep. 27, 2012 (DE) ......................... 10 2012 109 159

(51) Int. Cl.
| | |
|---|---|
| *H01L 23/495* | (2006.01) |
| *G01R 31/26* | (2014.01) |
| *G01R 27/02* | (2006.01) |
| *H01L 33/62* | (2010.01) |
| *H01L 21/66* | (2006.01) |

(52) U.S. Cl.
CPC ........ *H01L 23/49551* (2013.01); *G01R 27/02* (2013.01); *G01R 31/26* (2013.01); *H01L 22/14* (2013.01); *H01L 23/49555* (2013.01); *H01L 23/49562* (2013.01); *H01L 33/62* (2013.01); *H01L 22/20* (2013.01); *H01L 2224/48091* (2013.01); *H01L 2224/48247* (2013.01); *H01L 2924/12044* (2013.01)

(58) Field of Classification Search
CPC ............... H01L 23/49551; H01L 22/14; H01L 23/49555; H01L 23/49562; H01L 33/62; H01L 2924/12044; H01L 22/20; H01L 2224/48091; H01L 2224/48247; G01R 27/02; G01R 31/26
USPC ........................................................ 324/691
See application file for complete search history.

(56) References Cited

U.S. PATENT DOCUMENTS

| | | |
|---|---|---|
| 2002/0089064 A1 | 7/2002 | Wu |
| 2009/0109668 A1 | 4/2009 | Isobe |
| | (Continued) | |

FOREIGN PATENT DOCUMENTS

| | | |
|---|---|---|
| DE | 10 2007 019 809 A1 | 11/2007 |
| EP | 0 273 364 B1 | 7/1988 |
| | (Continued) | |

*Primary Examiner* — Billy Lactaoen
(74) *Attorney, Agent, or Firm* — DLA Piper LLP (US)

(57) ABSTRACT

A leadframe assembly is formed from an electrically conductive material. The leadframe assembly includes a first longitudinal element, at least one second longitudinal element, a plurality of first leadframe sections and a plurality of second leadframe sections.

14 Claims, 6 Drawing Sheets

(56) References Cited

U.S. PATENT DOCUMENTS

| | | | |
|---|---|---|---|
| 2009/0189261 A1* | 7/2009 | Lim | H01L 23/49551 |
| | | | 257/676 |
| 2010/0072509 A1 | 3/2010 | Huang et al. | |
| 2012/0028375 A1 | 2/2012 | Sato et al. | |
| 2015/0076549 A1* | 3/2015 | Gebuhr | H01L 33/005 |
| | | | 257/99 |
| 2015/0200138 A1* | 7/2015 | Schlereth | H01L 23/49565 |
| | | | 257/666 |

FOREIGN PATENT DOCUMENTS

| | | |
|---|---|---|
| JP | 63-236337 A | 10/1988 |
| JP | 01-236337 A | 9/1989 |

\* cited by examiner

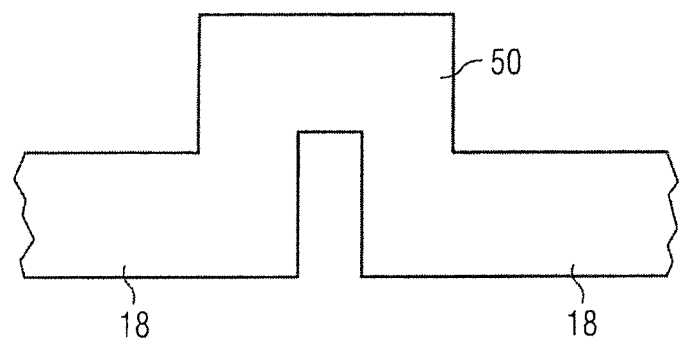
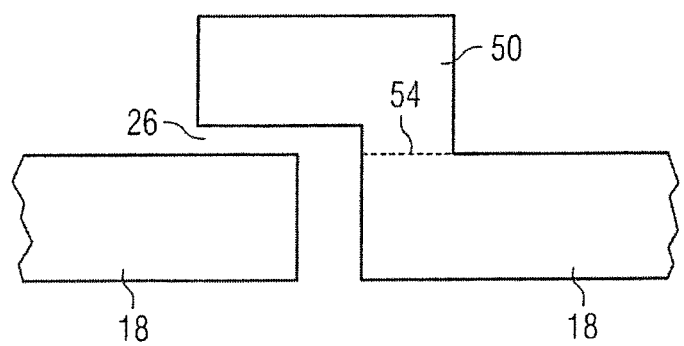
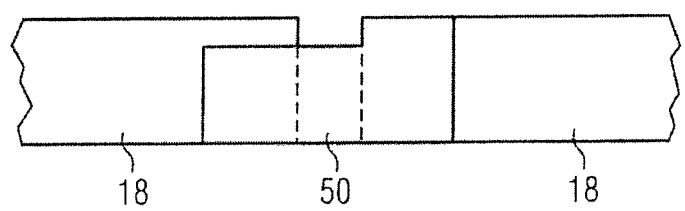

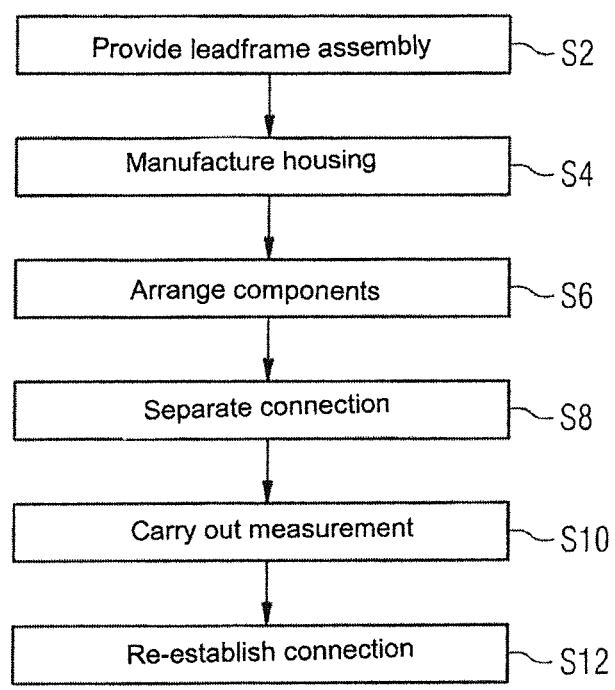

LEADFRAME ASSEMBLY, HOUSING ASSEMBLY, MODULE ASSEMBLY AND METHOD OF DETERMINING AT LEAST ONE VALUE OF A MEASUREMENT VARIABLE OF AN ELECTRONIC MODULE

RELATED APPLICATIONS

This is a continuation of International Application No. PCT/EP2013/069504, with an international filing date of Sep. 19, 2013 (WO 2014/048835A1, published Apr. 3, 2014), which is based on German Patent Application No. 10 2012 109 159.5, filed Sep. 27, 2012.

TECHNICAL FIELD

This disclosure relates to a leadframe assembly, a housing assembly, a module assembly and/or a method of determining at least one value of a measurement variable of an electronic module.

BACKGROUND

Optoelectronic components such as photodetectors, solar cells and/or LEDs or OLEDs are usually arranged in special housings. The housings and the optoelectronic components arranged therein are, e.g., referred to as electronic or optoelectronic modules. Such a housing comprises, e.g., a leadframe which, e.g., comprises or consists of two leadframe sections. The leadframe sections may, e.g., be physically separated from each other or serve as electrodes to electrically contact optoelectronic components. Furthermore, e.g., one of the leadframe sections may serve to fix optoelectronic components, as well.

The leadframes may, e.g., be singularized from a leadframe assembly. The leadframe assembly, e.g., comprises an electrically conductive material or is formed therefrom. The leadframes, e.g., mechanically fix and/or electrically contact the optoelectronic components. For this purpose, the leadframes each, e.g., comprise two leadframe sections, wherein, e.g., one of the leadframe sections comprises a receiving area that receives and/or contacts the electronic component, and the other leadframe section comprises a contact area that electrically contacts the electronic components. The leadframe assembly may be coated, e.g., metallized, prior to further processing.

It is known to produce a leadframe assembly such that it may be coiled up on a roller from which it may be uncoiled for further processing, e.g., in a roll-to-roll or reel-to-reel process. In this context, the leadframe assembly, e.g., has the shape of a structured metal band, e.g., a metal strip. The leadframe assembly may, e.g., be uncoiled, the housings may be provided at the uncoiled leadframes and the optoelectronic components may be arranged in the housings and subsequently the electronic modules comprising the optoelectronic components and housings in the module assembly may again be coiled up on a roller. As an alternative, the housings in the housing assembly may be coiled up again without the optoelectronic components and to arrange the optoelectronic components, the housing assembly may be uncoiled again.

In the roll-to-roll process, all elements of the leadframe assembly physically connect to one another and are thus electrically short-circuited. As a result, it is not possible to determine a value of a measurement variable of individual optoelectronic components in the module assembly. Such a measurement may be achieved by physically and/or electrically separating one of the contacts in the module to be measured, e.g., a leadframe section of the corresponding module, from the leadframe assembly. However, in that case galvanic metallizing of the separated leadframe section is no longer possible due to the electrical insulation caused by the physical separation. As an alternative, it is possible to galvanically metallize the leadframe prior to the physical separation. However, this will leave a non-metallized area at the interface after separating.

SUMMARY

We provide a leadframe assembly formed from an electrically conductive material including a first longitudinal element and at least one second longitudinal element arranged at a distance from the first longitudinal element, a plurality of first leadframe sections physically coupled to the first longitudinal element, extending in a direction of the second longitudinal element starting from the first longitudinal element and each including a first end section facing away from the first longitudinal element and facing the second longitudinal element, a plurality of second leadframe sections physically coupled to the second longitudinal element, extending in a direction of the first longitudinal element starting from the second longitudinal element, each including a second end section facing away from the second longitudinal element and facing the first longitudinal element, and which are each assigned to one of the first leadframe sections, wherein the first end sections of the first leadframe sections are arranged directly adjacent to the second end sections of the second leadframe sections assigned to the corresponding first leadframe sections, and in the second leadframe sections at least one lug is respectively formed and arranged such that after separating the physical connection between one of the second end sections and the second longitudinal element the corresponding lug may be bent such that the physical connection between the second end section and the second longitudinal element may be re-established by the bent lug.

We also provide a module assembly of electronic modules, including the leadframe assembly and a plurality of optoelectronic components, which each include a first electrical contact and a second electrical contact, wherein the first electrical contacts are respectively electrically coupled to one of the first end sections and the corresponding second electrical contacts are respectively electrically coupled to a second end section adjacent to the corresponding first end section.

We further provide a method of determining at least one value of a measurement variable of an electronic module in the module assembly of electronic modules, including the leadframe assembly and a plurality of optoelectronic components, which each include a first electrical contact and a second electrical contact, wherein the first electrical contacts are respectively electrically coupled to one of the first end sections and the corresponding second electrical contacts are respectively electrically coupled to a second end section adjacent to the corresponding first end section, wherein the physical connection between the second longitudinal element and the second end section of the second leadframe section, which is electrically contacted to the optoelectronic component to be measured, is separated, a first measuring electrode is electrically coupled to the first longitudinal element, a second measuring electrode is electrically coupled to the second end section, the value of the measurement variable is determined, and the lug assigned to the corresponding second leadframe section is bent such that the physical connection between the second longitudinal element and the corresponding second end section is re-established.

BRIEF DESCRIPTION OF THE DRAWINGS

FIG. 9 is a detailed view of an example of a lug in a first state.

FIG. 10 is a detailed view of the lug of FIG. 9 in a second state.

FIG. 11 is a detailed view of the lug of FIG. 9 in a third state.

FIG. 15 is a flow chart of an example of a method of determining a value of a measurement variable of an optoelectronic module in the module assembly.

DETAILED DESCRIPTION

Figure 1:
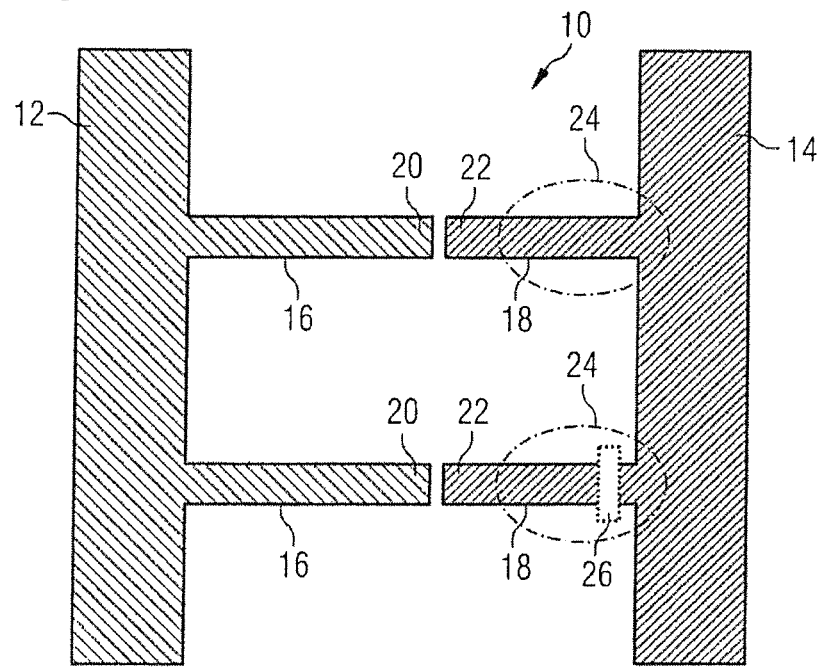
FIG. 1 schematically shows an example of a leadframe assembly.

We provide a leadframe assembly, a housing assembly and/or a module assembly which facilitate determining a value of a measurement variable of an optoelectronic component arranged in a housing of the module assembly in a simple manner. For example, the leadframe assembly, the housing assembly and/or the module assembly facilitate separating the electrical connections of individual electronic modules to the module assembly and re-establish the connection after measurement in a simple manner.

We also provide a method of determining a value of a measurement variable of an optoelectronic component which facilitates determining the measurement variable in the module assembly in a simple manner.

We further provide a leadframe assembly formed from an electrically conductive material. The leadframe assembly comprises a first longitudinal element and at least a second longitudinal element. The second longitudinal element is arranged at a distance from the first longitudinal element. Furthermore, the leadframe assembly comprises a plurality of first leadframe sections physically coupled to the first longitudinal element, which extend in the direction of the second longitudinal element starting from the first longitudinal element and which each comprise a first end section facing away from the first longitudinal element and facing the second longitudinal element. Furthermore, the leadframe assembly comprises a plurality of second leadframe sections physically coupled to the second longitudinal element, which extend in the direction of the first longitudinal element starting from the second longitudinal element and which each comprise a second end section facing away from the second longitudinal element and facing the first longitudinal element, and which are assigned to one of the first leadframe sections. The first end sections of the first leadframe sections are arranged directly adjacent to the second end sections of the second leadframe sections which are assigned to the corresponding first leadframe sections. In the second leadframe sections, at least one lug is respectively formed and arranged such that after separating the physical connection between one of the second end sections and the second longitudinal element the corresponding lug may be bent such that the physical connection between the second end section and the second longitudinal element may be re-established by the bent lug.

Within the leadframe assembly, the lug facilitates determining a value of a measurement variable of an optoelectronic component electrically coupled to one of the first leadframe sections and to a second leadframe section assigned to the corresponding first leadframe section. For this purpose, it may, e.g., be sufficient to separate a physical and/or electrical connection between the corresponding second end section and the second longitudinal element, thus preventing a short. The measurement may then be carried out. Upon determining the value, the physical and/or electrical connection may be re-established in a simple manner by bending the lug. The lug may, e.g., be in an integral configuration with the leadframe assembly, e.g., in an integral configuration with the second leadframe section or the second longitudinal element. The lug may, e.g., be formed by etching or stamping.

A leadframe may, e.g., comprise two or more of the leadframe sections. The leadframe may, e.g., be a metal structure correspondingly having one, two or more metal pieces as leadframe sections. A plurality of leadframes and/or the corresponding leadframe sections may, e.g., be held together in the leadframe assembly which is, e.g., a metal frame, e.g., a metal band, e.g., a metal strip. A leadframe assembly may, e.g., be formed from a leadframe blank which may, e.g., be a flat metal band, e.g., by a chemical process such as etching, or by a mechanical process such as stamping. The leadframe assembly may comprise a plurality of leadframe sections which may later, e.g., form electrodes and which in the leadframe assembly may, e.g., be connected to one another by the longitudinal elements. One of the leadframes may comprise the leadframe sections which, e.g., form the electrodes, wherein the leadframe sections are no longer physically connected to one another by the metal, i.e., after the leadframes have, e.g., already been singularized. Thus, in a clear manner, the electrodes form the leadframe itself or represent singularized parts of a leadframe assembly.

When manufacturing the housings, the leadframe assembly, particularly regions of the leadframe sections, may, e.g., be embedded in a mold compound, e.g., in a molding process, e.g., by injection molding or transfer molding. The mold compound may, e.g., be a plastic coating. The mold compound may, e.g., comprise a thermoplast, e.g., polyphtalamide (PPA), a thermoset, e.g., epoxide or polyurethane resin, an elastomer such as silicone, or a hybrid material which, e.g., comprises one of the aforementioned materials. The formation consisting of mold compound and the leadframe assembly embedded therein may also be referred to as housing assembly. The fact that the leadframe assembly or, respectively, the leadframes are embedded in the mold compound, e.g., means that the leadframes or, respectively, their leadframe sections are at least partially surrounded by the mold compound. Parts of the leadframes may remain free of mold compound. For example, on a top surface of the leadframes, receiving recesses in which the receiving areas and/or contact areas are exposed, and/or the longitudinal elements and/or regions of the leadframe sections following the longitudinal elements may be free of mold compound.

The two longitudinal elements may extend in parallel with regard to each other. Alternatively or additionally, the first leadframe sections extend in parallel to one another. Alternatively or additionally, the second leadframe sections extend in parallel to one another. For example, the leadframe sections extend perpendicularly or at least essentially perpendicularly to the longitudinal elements. The first leadframe sections and the second leadframe sections assigned to them, e.g., each form a pair of leadframe sections and the pairs of leadframe sections may be arranged in parallel with regard to one another.

The leadframe assembly may have a ladder-shaped configuration. The two longitudinal elements may, e.g., form the stringers of the ladder shape and/or the first and second leadframe sections, e.g., the pairs of leadframe sections, may, e.g., form the rungs of the ladder shape.

The second longitudinal element may comprise the lugs. This may, e.g., contribute to manufacture the lugs without additional need for material and/or not to weaken the second leadframe sections.

The second leadframe sections may comprise the lugs. This may, e.g., contribute to not weaken the second longitudinal element in spite of forming the lugs.

The lug may be formed from the material of the second leadframe section and/or of the second longitudinal element. The material is arranged in addition to the material of the second leadframe section and/or the second longitudinal element which is necessary to physically and/or electrically connect the second end section to the second longitudinal section. In other words, more material is provided, e.g., as a reserve, than would be necessary for the direct physical connection. Upon separating the physical connection to measure the measuring value, the reserve material may then serve to re-establish the physical connection.

The leadframe assembly may be in a flat configuration and the longitudinal elements and the leadframe sections are located in one plane, the lugs being arranged in the same plane. This may, e.g., contribute to being able to form the lugs in a simple manner.

The leadframe assembly may have a flat configuration and the longitudinal elements and the leadframe sections are located in one plane, the lugs at least partially extending in a direction perpendicular to the plane. This may, e.g., contribute to being able to form the lugs in a simple manner. The fact that the lugs extend at least partially in a direction perpendicular to the plane may, e.g., mean that the reserve material from which the lug is formed is arranged outside of the plane, and/or that the lug at least in a partial section extends in a direction having a directional component perpendicular to the plane.

The leadframe assembly is, e.g., formed from a metal band and/or the leadframe assembly is a structured metal band, wherein the structure may, e.g., be determined by the leadframe sections, and the plane is the plane in which the uncoiled metal band lies.

We still further provide a housing assembly for optoelectronic components. The housing assembly comprises a leadframe assembly, e.g., the aforementioned leadframe assembly, wherein the first end sections and the second end sections adjacent thereto are each embedded in a molded body. The first end sections, the second end sections adjacent thereto and the corresponding molded bodies each form a housing for at least one optoelectronic component.

We yet further provide a module assembly of electronic modules. The module assembly comprises a leadframe assembly, e.g., the aforementioned leadframe assembly, and a plurality of optoelectronic components. The optoelectronic components each comprise a first electrical contact and a second electrical contact. The first electrical contacts are each electrically coupled to one of the first end sections and the corresponding second electrical contacts are each electrically coupled to one of the second end sections adjacent to the corresponding first end section.

Various examples provide a module assembly of electronic modules comprising a housing assembly, e.g., the aforementioned housing assembly. In each housing, at least one optoelectronic component is arranged. The optoelectronic components each comprise a first electrical contact being electrically coupled to the corresponding first end section, and a second electrical contact being electrically coupled to the corresponding second end section.

Various examples provide a method of determining at least one value of a measurement variable of an electronic module in a module assembly, e.g., the aforementioned module assembly. In this method, the physical connection between the second longitudinal element and the second end section of the second leadframe section, which is electrically contacted with the optoelectronic component to be measured, is separated. A first measuring electrode is electrically coupled to the first longitudinal element. A second measuring electrode is electrically coupled to the second end section. The value of the measurement variable is determined. The lug assigned to the corresponding second leadframe section is bent such that the physical connection between the second longitudinal element and the corresponding second end section is re-established.

The value may be determined by the measuring electrodes. By the measuring electrodes, e.g., a voltage may be applied to the optoelectronic component and a value of an electric resistance of the electronic module may be determined. In this context, e.g., the electric resistance of the electronic module may be the measurement variable.

The optoelectronic component may be supplied with energy and operated by the measuring electrodes. During operation of the optoelectronic component, the value is determined by a measurement device. If the optoelectronic component is, e.g., a component emitting electromagnetic radiation, the measurement variable may, e.g., refer to the electromagnetic radiation generated by the optoelectronic component. The measurement variable may, e.g., be an illumination or a light intensity and/or a wavelength range of the emitted electromagnetic radiation, wherein in this context the measurement device may, e.g., comprise a photosensor for detecting the value.

The physical connection between the second longitudinal element and the corresponding second end section may be re-established in a form-fit manner. The connection may, e.g., be re-established by joining by shearing and upsetting (e.g., by clinching). Alternatively, the connection may be re-established by riveting and/or soldering.

The housings may subsequently be singularized from the housing assembly, e.g., by sawing, stamping or cutting.

Examples are described in conjunction with the drawings and will be explained in more detail in the following.

In the following detailed description, reference is made to the accompanying drawings which are part of the description and in which specific examples are shown for the purpose of illustration. In this respect, directional terminology such as "top," "bottom," "front," "back" and the like is used with reference to the orientation of the described drawing(s). As components of examples may be positioned in a number of different orientations, the directional terminology serves the purpose of illustration and is not to be considered limiting. Of course, other examples may be used and structural or logical modifications may be carried out without exceeding the protective scope of this disclosure. Of course, the features of the various examples described herein may be combined with one another, unless specific information to the contrary is provided. The following detailed description is thus not to be considered limiting, and the protective scope is defined by the appended claims.

The terms "connected," "contacted" and "coupled" are used to describe a direct as well as indirect connection, a direct or indirect contact as well as direct or indirect coupling. In the drawings, identical or similar elements are referred to by identical reference numerals, if appropriate.

In various examples, an optoelectronic component may be a component emitting electromagnetic radiation or a component absorbing electromagnetic radiation. A component absorbing electromagnetic radiation may, e.g., be a solar cell. In various examples, a component emitting electromagnetic radiation may be a semiconductor component emitting electromagnetic radiation and/or be formed as a diode emitting electromagnetic radiation as a diode emitting organic electromagnetic radiation, as a transistor emitting electromagnetic radiation or as a transistor emitting organic electromagnetic radiation. The radiation may, e.g., be light in the visible range, ultraviolet light and/or infrared light. In this context, the component emitting electromagnetic radiation may, e.g., be formed as a light-emitting diode (LED), as an organic-light-emitting diode (OLED), as a light-emitting transistor or as an organic-light-emitting transistor. In various examples, the light-emitting component may be part of an integrated circuit. Moreover, a plurality of light-emitting components may be provided which is, e.g., accommodated in a shared housing.

FIG. 1 shows a leadframe assembly 10. The leadframe assembly 10 comprises a first longitudinal element 12 and a second longitudinal element 14. Furthermore, the leadframe assembly 10 comprises a plurality of first leadframe sections 16 which extends from the first longitudinal element 12 in the direction of the second longitudinal element 14. The first leadframe sections 16 are, e.g., formed integrally with the first longitudinal element 12. Furthermore, the leadframe assembly 10 comprises a plurality of second leadframe sections 18 which extends from the second longitudinal element 14 in the direction of the first longitudinal element 12. The second leadframe sections 18 may, e.g., be formed integrally with the second longitudinal element 14.

The first leadframe sections 16 may, e.g., each comprise a first end section 20 facing away from the first longitudinal element 12 and facing the second longitudinal element 14. The second leadframe sections 18 may, e.g., comprise a second end section 22 facing away from the second longitudinal element 14 and facing the first longitudinal element 12. The first leadframe sections 16 and the second leadframe sections 18 may, e.g., each be arranged in pairs. The leadframe sections 16, 18 of one of the pairs may, e.g., be assigned to each other. The first leadframe sections 16 and the second leadframe sections 18 assigned thereto may, e.g., each form a pair of leadframe sections 16, 18. The first end section 20 of a pair of leadframe sections 16, 18 may, e.g., be arranged directly adjacent to the second end section 22 of the same pair of leadframe sections 16, 18. In other words, the end sections 20, 22 of a pair of leadframe sections 16, 18 may, e.g., face each other. Between the first end sections 20 and the second end sections 22 of each of the pairs of leadframe sections 16, 18, e.g., small gaps may be formed so that no direct physical connection exists between the first end sections 20 and the second end sections 22.

For each second leadframe section 18, one lug region 24 is respectively provided between the second end sections 22 and the second longitudinal element 14, wherein the lug regions 24 may overlap the second longitudinal element 14. A lug (not shown in FIG. 1) is arranged in each lug region 24. In the lug region 24, reserve material is kept, e.g., in the form of the lug. The reserve material is part of the leadframe assembly 10. The reserve material may, e.g., be in the same plane as the second longitudinal element 14 and/or the second leadframe sections 18. Alternatively or additionally, the reserve material may at least partially extend in a direction perpendicular to the plane.

In a method of determining a measurement variable of an electronic module comprising the leadframe assembly 10, the physical and/or electrical connection between the second end section 22 and the second longitudinal element 14 may be separated in an interface 26. In FIG. 1 the interface 26 is arranged within the lug region 24 close to the second longitudinal element 14. Alternatively, the interface 26 may also be arranged in the lug region 24 near the second end section 22.

The leadframe assembly 10, e.g., the two longitudinal elements 12, 14 and the leadframe sections 16, 18 may, e.g., comprise an electrically conductive material or be formed therefrom. For example, the leadframe assembly 10 is altogether formed in an electrically conductive manner. The electrically conductive material, e.g., comprises a metal such as copper, e.g., CuW or CuMo, copper alloys, brass, nickel and/or iron such as FeNi and/or is formed therefrom. A thickness of one of the leadframes may, e.g., be 100 μm to 500 μm, e.g., 150 μm to 300 μm.

Furthermore, the leadframe assembly 10 may, e.g., be coated, e.g., metallized, e.g., by a galvanic process and, e.g., with silicon, nickel, palladium and/or gold or with an alloy comprising, e.g., one or more of the mentioned materials.

Figure 2:
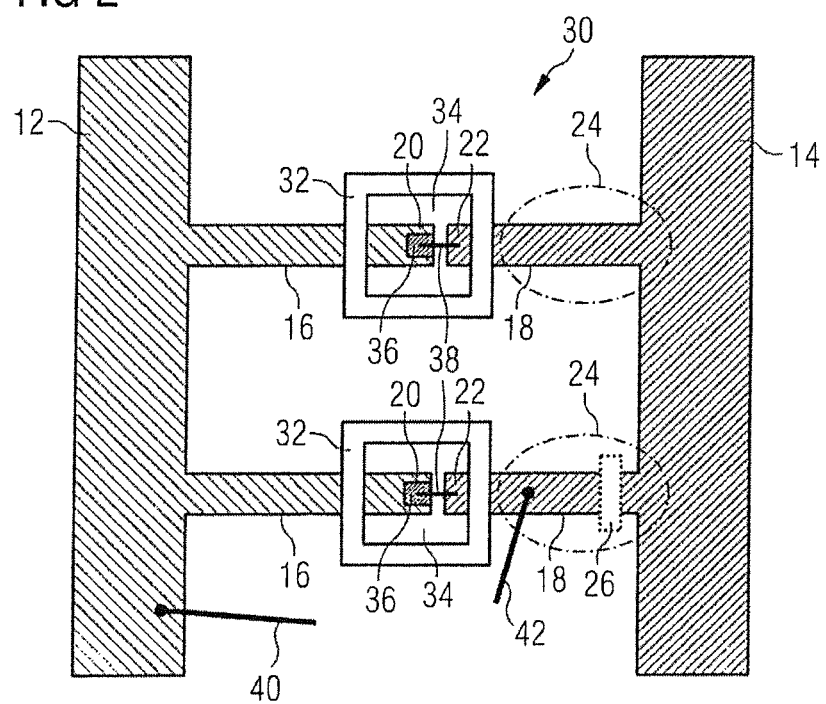
FIG. 2 schematically shows an example of a module assembly.

FIG. 2 shows a module assembly 30 which may, e.g., comprise the leadframe assembly 10 of FIG. 1. The module assembly 30, e.g., comprises a housing assembly which may, e.g., comprise the leadframe assembly 10 of FIG. 1. The housing assembly may, e.g., comprise a plurality of housings in addition to the leadframe assembly 10, e.g., one housing for each pair of leadframe sections 16, 18. Each of the housings at least comprises one of the first end sections 20 and the second end section 22 adjacent thereto, as well as a molded body 32 in which the corresponding end sections 20, 22 are embedded. The housings are suitable for, e.g., fixing and/or electrically contacting to a printed circuit board. The printed circuit board may, e.g., be a printed circuit board of the FR1, FR2, FR3, FR4, FR5, CEM1, CEM2, CEM3, CEM4 or CEM5 type, e.g., an FR-4 printed circuit board having a through-contact. The thickness of one of the housings may, e.g., be 100 μm to 3 mm, e.g., 200 μm to 1 mm, e.g., 250 μm to 500 μm.

The molded body 32 may, e.g., be formed such that the mold compound from which the molded body 32 has been formed is, e.g., arranged between the two corresponding end sections 20, 22 and electrically insulates them from one another. Alternatively or additionally, the molded body 32 may comprise a receiving recess 34 in which the two end sections 20, 22 are at least partially uncovered.

As an alternative or in addition, at least one optoelectronic component 36 may be arranged in the receiving recess 34. The optoelectronic component 36 may, e.g., be arranged on the first end section 20 and electrically contacted thereto and/or be electrically contacted with the second end section 22 by a bond wire 38. As an alternative thereto, the end sections 20, 22 may merely be provided to electrically contact the optoelectronic component 36 and the optoelectronic component 36 may be arranged outside of the end sections 20, 22 in the receiving recess 34. A pair of end sections 20, 22 in combination with the corresponding molded body 32 may be referred to as a housing for the optoelectronic component 36. The housing in combination with the optoelectronic component 36 may be referred to as electronic, e.g., optoelectronic module.

The electronic modules and/or the optoelectronic modules physically connect to each other via the module assembly 30. Moreover, the electronic modules and/or the optoelectronic components 36 arranged therein are electrically short-circuited via the leadframe assembly 10. Short-circuited in such a way, the optoelectronic components 36 in the module assembly cannot be electrically contacted so that a value of a measurement variable of one of the modules or of the corresponding optoelectronic component cannot be determined.

To determine the value of the measurement variable, however, the physical and/or electrical connection between one or several of the second end sections 22 and the second longitudinal element 14 may be interrupted in the interface 26, e.g., by separating the second leadframe section 18 between the corresponding second end section 22 and the second longitudinal element 14, e.g., by cutting, sawing or stamping. Subsequently, a first measuring electrode may be electrically coupled to the first end section 20, e.g., the first measuring electrode 40 may be applied to the first longitudinal element 12 or to the corresponding first leadframe section 16. A second measuring electrode 42 may be electrically coupled to the second end section 22. The second measuring electrode 42 may, for example, be electrically coupled to the part of the second leadframe assembly 18 or be applied thereto, the part of the second leadframe assembly 18 still being directly and physically coupled to the second end section 22.

Figure 3:
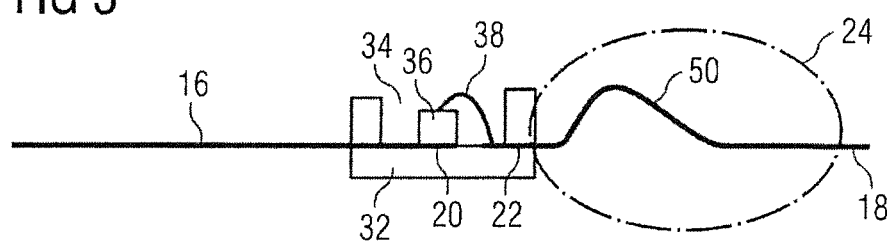
FIG. 3 is a sectional view of an example of a housing in a module assembly in a first state.

FIG. 3 depicts a sectional view through one of the electronic modules in the housing assembly 30. FIG. 3 shows that the second leadframe section 18 comprises a lug 50 in the lug region 24. For example, the second leadframe section 18 may comprise material in the lug region 24 which would be unnecessary or superfluous to directly physically couple the second end section 22 to the second longitudinal element 14, e.g., a reserve material. The lug 50 may, e.g., be formed from material of the second leadframe section 18 arranged in addition to the material of leadframe 18, which is required to connect the second longitudinal element 14 to the second end section 22. The material for this connection, which is at first superfluous, may, e.g., be kept in reserve at least partially perpendicularly with regard to the plane in which the longitudinal elements 12, 14 and/or the leadframe sections 16, 18 are arranged. For example, the second leadframe section 18 may be bent out of shape in the lug region 24 in a direction perpendicular to the plane. As a result, more material is present in the lug region 24 than would be necessary for a direct physical coupling.

Figure 4:
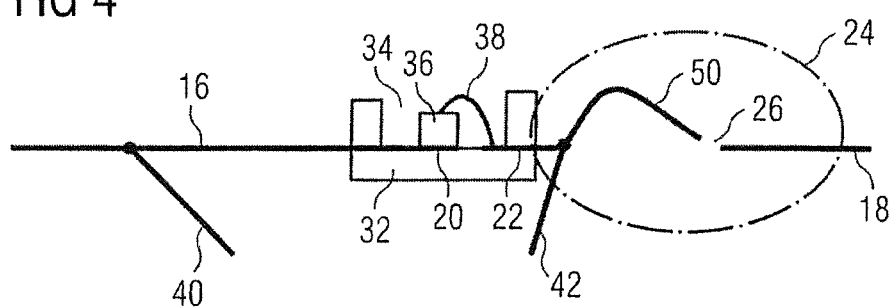
FIG. 4 is a sectional view of the housing according to FIG. 3 in the module assembly in a second state.

FIG. 4 shows a sectional view through the electronic module of FIG. 3 after separating the physical and/or electrical connection between the second end section 22 and the second longitudinal element 14 in the interface 26. Furthermore, FIG. 4 shows that the first end section 20 is electrically coupled to the measuring electrode 40 and that the second end section 22 is electrically coupled to the second measuring electrode 42. In this second state, the value of the measurement variable may be determined.

Figure 5:
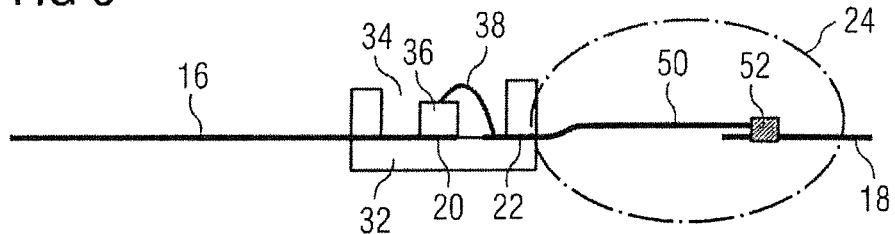
FIG. 5 is a sectional view of the electronic module of FIG. 3 in the module assembly in a third state.

FIG. 5 shows a sectional view through the electronic module of FIG. 3 in a third state, e.g., upon determining the value of the measurement variable. Compared to the lug 50 shown in FIG. 3, the lug 50 of FIG. 5 may be rather flattened so that the reserve material of the lug 50 kept in the lug region 24 overlaps the part of the second leadframe section 18 connected to the second longitudinal element 14 or the second longitudinal element 14. By a connection 52, the lug 50 may physically and/or electrically connect to the second leadframe section 18 or, respectively, to the second longitudinal element 14.

The connection 52 may, e.g., be a material fit or a form fit. The material-fit connection may, e.g., be produced by soldering or an electrically conductive adhesive. The form-fit connection may, e.g., be produced by a rivet and/or joining by shearing and upsetting (e.g., clinching). The joining-by-shearing-and-upsetting process may, e.g., be carried out involving cutting or not.

Figure 6:
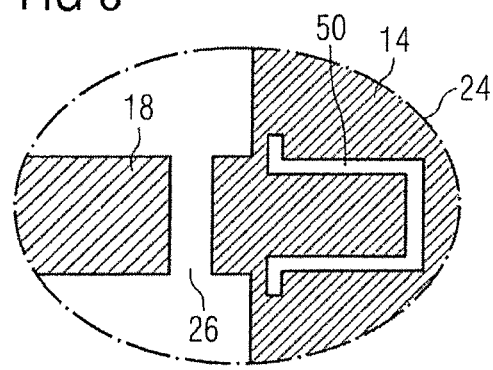
FIG. 6 is a detailed view of an example of a lug in a first state.

FIG. 6 shows a detailed view of an example of a lug 50 in a first state, wherein the lug 50 may, e.g., be formed in the second longitudinal element 14. Alternatively, the lug 50 may, e.g., be formed in the second leadframe section 18. The lug 50 may, e.g., be formed in the second longitudinal element 14 by etching or stamping. In a first state, the lug 50 lies flat in the plane of the second longitudinal element 14 and in this plane it is surrounded by the second longitudinal element 14 in all directions. The physical and/or electrical connection between the second longitudinal element 14 and the corresponding second leadframe section 18 is separated at an interface 26. In this state, the value of the measurement variable may be determined.

Figure 7:
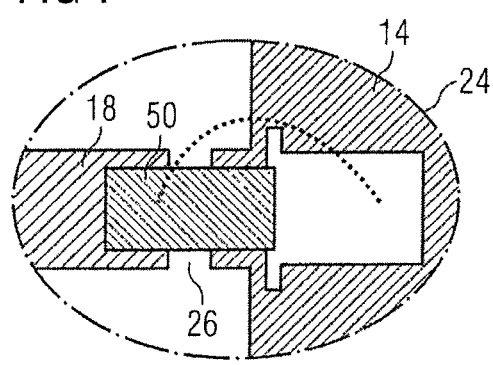
FIG. 7 is a detailed view of the lug of FIG. 6 in a second state.

FIG. 7 shows a detailed view of the lug 50 of FIG. 6 in a second state into which the lug 50 is, e.g., brought upon determining the value and in which the lug 50 is, e.g., bent in the direction of the second leadframe section 18. For example, the lug 50 is formed in such a way and in FIG. 7 bent such that it at least partially overlaps the second leadframe section 18.

Figure 8:
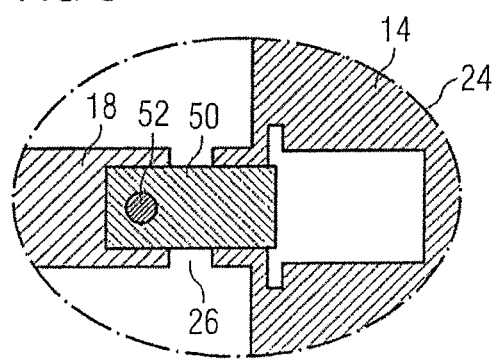
FIG. 8 is a detailed view of the lug of FIG. 6 in a third state.

FIG. 8 shows a detailed view of the lug 50 of FIG. 6 in a third state in which the lug 50 physically and/or electrically connects to the second leadframe section 18 by the connection 52. The connection 52 may, e.g., be formed according to the connection 52 described in context with FIG. 5.

FIG. 9 depicts a detailed view of an example of the lug 50 in a first state. Similar to the example shown in FIG. 3, the lug 50 is formed from additional material which is kept as a reserve in the second leadframe section 18 to subsequently re-establish the physical and/or electrical connection between the second end section 22 and the second longitudinal element 14. Contrary to the example shown in FIG. 3, however, in the example of FIG. 9 the additional material of the lug 50 is kept in the plane in which the second leadframe section 18 is located. In other words, the additional material of the second lug 50 is in the same plane as the second leadframe section 18.

FIG. 10 shows a detailed view of the lug 50 of FIG. 9 in a second state in which the physical and/or electrical connection between the second end section 22 and the second longitudinal element has been separated in the interface 26 and in which, e.g., the value may be determined. A bending edge 54, shown as a dashed line in FIG. 10, refers to an edge at which the lug 50 may, e.g., be bent to re-establish the physical and/or electrical connection.

FIG. 11 shows a detailed view of the lug 50 of FIG. 9 in a third state in which the lug 50 may, e.g., be bent around the bending edge 54 such that the lug 50 overlaps the part of the leadframe section 18 shown on the left side of FIG. 11 in an overlapping area. Subsequently, the connection 52 may be formed in the overlapping area of the lug 50, e.g., in accordance with FIG. 5 or 8.

Figure 12:
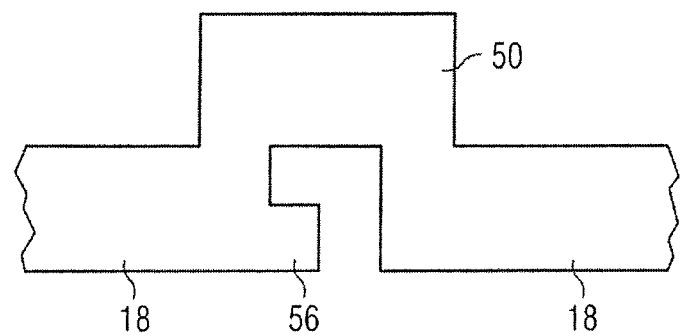
FIG. 12 is a detailed view of an example of a lug in a first state.

FIG. 12 shows a detailed view of an example of the lug 50 in a first state in which, similar to FIG. 9, the additional material of the lug 50 is kept in reserve in the plane of the second leadframe section 18. In other words, the material of the lug 50 may, e.g., be in the same plane as the second leadframe section 18. The part of the second leadframe section 18 shown on the left side of FIG. 12 comprises a protrusion 56 extending from the corresponding second leadframe section 18 in the direction of the part of the second leadframe section 18 shown on the right side of FIG. 12.

Figure 13:
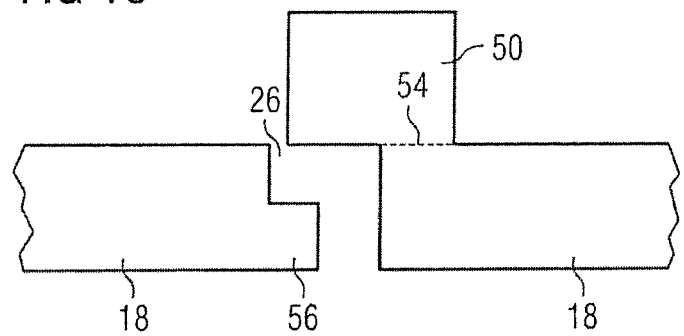
FIG. 13 is a detailed view of the lug of FIG. 12 in a second state.

FIG. 13 shows a detailed view of the lug 50 of FIG. 12 in a second state in which the physical and/or electrical connection between the second end section 22 and the second longitudinal element 14 is separated by separating the second leadframe section 18 at the interface 26 and in which the value of the measurement variable may be determined. Furthermore, FIG. 13 shows the bending edge 54 around which the lug 50 may subsequently be bent to re-establish the physical and/or electrical connection.

Figure 14:
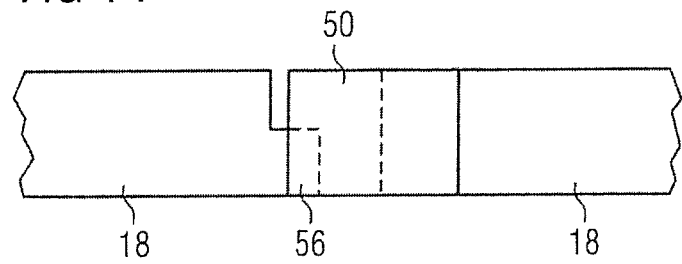
FIG. 14 is a detailed view of the lug of FIG. 12 in a third state.

FIG. 14 shows a detailed view of the lug 50 of FIG. 12 in a third state in which the lug 50 is bent around bending edge 54 such that it overlaps the protrusion 56, e.g., upon determining the value. The physical and/or electrical connection is thus re-established by the protrusion 56 and the lug 50. In the overlapping area between the protrusion 56 and the lug 50, the connection 52 may be formed.

FIG. 15 shows a flow chart of a method of determining a value of a measurement variable of an electronic module in a module assembly, e.g., one of the above-described electronic modules in the module assembly 30. In case only one measurement variable of an optoelectronic component is determined in this method, the method may also be referred to as a method of determining a value of a measurement variable of an optoelectronic component in the module assembly.

In a step S2, a leadframe assembly is provided, e.g., the above-described leadframe assembly 10.

In a step S4, a housing assembly, e.g., the above-described housing assembly, may be formed by configuring a plurality of housings. For example, one housing may respectively be formed by the mold compound for each pair of leadframe sections 16, 18.

In step S6, a module assembly may be produced, e.g., the above-described module assembly 30. For example, the optoelectronic components may be arranged in the housings. For example, one, two or more optoelectronic components may be arranged in each housing. Arranging the optoelectronic components in the housings, e.g., comprises physically fixing the corresponding optoelectronic components in the corresponding housings and electrically contacting the electrical contacts of the optoelectronic components to the corresponding first end sections 20 and to the corresponding second end sections 22. In addition, the optoelectronic components arranged in the housings may be embedded in an encapsulation material. The encapsulation material may, e.g., comprise a conversion material to convert the electromagnetic radiation, e.g., with regard to its wavelength.

In a step S8, the connections of the electronic modules to be measured with the second longitudinal element 14, e.g., the physical and/or electrical connections between the second end sections 22 and the second longitudinal element 14 are separated, e.g., at the interface 26.

In a step S10, the measurement is taken, e.g., by applying the measuring electrodes 40, 42. By the measuring electrodes 40, 42, e.g., a voltage may be applied and as a value, a value of an electrical measurement resistance of the currently measured electronic module may be determined. This may, e.g., contribute to verifying whether the optoelectronic component is in electrical contact with the corresponding end sections 20, 22, as intended. As an alternative thereto, a voltage may by the measuring electrodes 40, 42 be applied to the electronic module to be measured such that the corresponding optoelectronic component 36 is put into operation, wherein the measurement variable may, e.g., refer to an operating parameter of the optoelectronic component 36. The operating parameter may, e.g., be determined by a measurement device, e.g., by an external measurement device. If the optoelectronic component is a component emitting electromagnetic radiation, the measurement variable may, e.g., refer to the generated electromagnetic radiation. For example, the measurement device may comprise a photo-detector and/or a photo-sensor which, e.g., determines the illumination, light intensity and/or wavelength of the electromagnetic radiation.

In a step S12, the physical connection between the second end section 22 and the second longitudinal element 14 may be re-established, e.g., by bending the lug 50 such that the physical connection is re-established.

Subsequently, the method of determining the value of the measurement variable may be completed. As the electronic modules are still connected to one another in the module assembly 30, one, two or more subsequent processes may now be carried out in the module assembly 30 in a simple manner.

A metallization of sections of the leadframe sections 16, 18 may, e.g., be carried out in a galvanic process. As an alternative or in addition, two or more process parameters may be adjusted depending on the measurement of the measurement variable. Depending on the measurement, e.g., the amount of encapsulation material per housing and/or the amount of conversion material per housing may be adjusted.

Our assemblies, modules and methods are not limited to the indicated examples. For example, the leadframe assembly 10 may comprise further longitudinal elements. Alternatively or additionally, three or more leadframe sections may be provided for one housing. Alternatively or additionally, more than one optoelectronic component 36 may be arranged in one of the housings. Furthermore, the lug 50 may have other geometries or other designs.

The invention claimed is:

1. A leadframe assembly formed from an electrically conductive material comprising:
   a first longitudinal element and at least one second longitudinal element arranged at a distance from the first longitudinal element;
   a plurality of first leadframe sections physically coupled to the first longitudinal element, extending in a direction of the second longitudinal element starting from the first longitudinal element and each comprising a first end section facing away from the first longitudinal element and facing the second longitudinal element; and
   a plurality of second leadframe sections physically coupled to the second longitudinal element, extending in a direction of the first longitudinal element starting from the second longitudinal element, each comprising a second end section facing away from the second longitudinal element and facing the first longitudinal element, and which are each assigned to one of the first leadframe sections, wherein the first end sections of the first leadframe sections are arranged directly adjacent to the second end sections of the second leadframe sections assigned to the corresponding first leadframe sections, in the second leadframe sections at least one lug is respectively formed and arranged such that after separating the physical connection between one of the second end sections and the second longitudinal element the corresponding lug may be bent such that the physical connection between the second end section and the second longitudinal element may be re-established by the bent lug, and the second longitudinal element comprises the lugs.

2. The leadframe assembly of claim 1, wherein the two longitudinal elements extend in parallel with regard to each other and/or wherein the first leadframe sections extend in parallel with regard to each other and/or the second leadframe sections extend in parallel with regard to each other.

3. The leadframe assembly of claim 2, wherein the leadframe assembly has a ladder-shaped configuration, the two longitudinal elements form stringers and the first and second leadframe sections form rungs of the ladder shape.

4. The leadframe assembly of claim 1, wherein the second leadframe sections comprise the lugs.

5. The leadframe assembly of claim 1, wherein the lug is formed by material of the second leadframe section and/or of the second longitudinal element, which is arranged in addition to the material of the second leadframe section and/or of the second longitudinal element, and which is necessary to physically and/or electrically connect the second end section to the second longitudinal section.

6. The leadframe assembly of claim 5, wherein the leadframe assembly has a flat configuration, the longitudinal elements and the leadframe sections are located in one plane, and the lugs are arranged in the same plane.

7. The leadframe assembly of claim 5, wherein the leadframe assembly has a flat configuration, the longitudinal elements and the leadframe sections are located in one plane, and the lugs extend in a direction perpendicular to said plane.

8. A module assembly of electronic modules, comprising the leadframe assembly of claim 1 and a plurality of optoelectronic components, which each comprise a first electrical contact and a second electrical contact, wherein the first electrical contacts are respectively electrically coupled to one of the first end sections and the corresponding second electrical contacts are respectively electrically coupled to a second end section adjacent to the corresponding first end section.

9. The module assembly of claim 8, wherein the first end sections and the second end sections adjacent thereto are each embedded in a molded body, and the first end sections, the second end sections adjacent thereto and the corresponding molded bodies each form a housing for one optoelectronic component.

10. A method of determining at least one value of a measurement variable of an electronic module in a module assembly of electronic modules, comprising a leadframe assembly formed from an electrically conductive material comprising:

a first longitudinal element and at least one second longitudinal element arranged at a distance from the first longitudinal element;

a plurality of first leadframe sections physically coupled to the first longitudinal element, extending in a direction of the second longitudinal element starting from the first longitudinal element and each comprising a first end section facing away from the first longitudinal element and facing the second longitudinal element;

a plurality of second leadframe sections physically coupled to the second longitudinal element, extending in a direction of the first longitudinal element starting from the second longitudinal element, each comprising a second end section facing away from the second longitudinal element and facing the first longitudinal element, and which are each assigned to one of the first leadframe sections, wherein the first end sections of the first leadframe sections are arranged directly adjacent to the second end sections of the second leadframe sections assigned to the corresponding first leadframe sections, and in the second leadframe sections at least one lug is respectively formed and arranged such that after separating the physical connection between one of the second end sections and the second longitudinal element the corresponding lug may be bent such that the physical connection between the second end section and the second longitudinal element may be re-established by the bent lug, and a plurality of optoelectronic components, which each comprise a first electrical contact and a second electrical contact, wherein the first electrical contacts are respectively electrically coupled to one of the first end sections and the corresponding second electrical contacts are respectively electrically coupled to a second end section adjacent to the corresponding first end section comprising:

separating the physical connection between the second longitudinal element and the second end section of the second leadframe section, which is electrically contacted to the optoelectronic component to be measured, electrically coupling a first measuring electrode to the first longitudinal element, electrically coupling a second measuring electrode to the second end section, determining the value of the measurement variable, and bending the lug assigned to the corresponding second leadframe section such that the physical connection between the second longitudinal element and the corresponding second end section is re-established.

11. The method of claim 10, wherein the value is determined by measuring electrodes.

12. The method of claim 10, wherein the optoelectronic component is supplied with energy and operated by the measuring electrodes, and the value is determined by a measurement device.

13. The method of claim 10, wherein the physical connection between the second longitudinal element and the corresponding second end section is re-established in a form-fit manner.

14. A leadframe assembly formed from an electrically conductive material comprising:

a first longitudinal element and at least one second longitudinal element arranged at a distance from the first longitudinal element;

a plurality of first leadframe sections physically coupled to the first longitudinal element, extending in a direction of the second longitudinal element starting from the first longitudinal element and each comprising a first end section facing away from the first longitudinal element and facing the second longitudinal element; and a plurality of second leadframe sections physically coupled to the second longitudinal element, extending in a direction of the first longitudinal element starting from the second longitudinal element, each comprising a second end section facing away from the second longitudinal element and facing the first longitudinal element, and which are each assigned to one of the first leadframe sections, wherein 1) the first end sections of the first leadframe sections are arranged directly adjacent to the second end sections of the second leadframe sections assigned to the corresponding first leadframe sections, 2) in the second leadframe sections at least one lug is respectively formed and arranged such that after separating the physical connection between one of the second end sections and the second longitudinal element the corresponding lug may be bent such that the physical connection between the second end section and the second longitudinal element may be re-established by the bent lug, 3) the lug is formed by material of the second leadframe section and/or of the second longitudinal element, which is arranged in addition to the material of the second leadframe section and/or of the second longitudinal element, and which is necessary to physically and/or electrically connect the second end section to the second longitudinal section, 4) the leadframe assembly has a flat configuration, 5) the longitudinal elements and the leadframe sections are located in one plane, and 6) the lugs extend in a direction perpendicular to said plane.

* * * * *